(12) United States Patent
Watanabe et al.

(10) Patent No.: US 8,299,501 B2
(45) Date of Patent: Oct. 30, 2012

(54) NITRIDE SEMICONDUCTOR DEVICE

(75) Inventors: Kentaro Watanabe, Anan (JP);
Shunsuke Minato, Anan (JP); Giichi Marutsuki, Anan (JP)

(73) Assignee: Nichia Corporation, Tokushima (JP)

( * ) Notice: Subject to any disclaimer, the term of this patent is extended or adjusted under 35 U.S.C. 154(b) by 588 days.

(21) Appl. No.: 12/155,070

(22) Filed: May 29, 2008

(65) Prior Publication Data
US 2008/0296627 A1 Dec. 4, 2008

(30) Foreign Application Priority Data

May 30, 2007 (JP) ............... P2007-143208
May 27, 2008 (JP) ............... P2008-138074

(51) Int. Cl.
*H01L 21/28* (2006.01)
(52) U.S. Cl. ............ 257/200; 257/98; 257/99; 257/190; 257/E33.062
(58) Field of Classification Search .......... 257/190, 257/200, 98, 99
See application file for complete search history.

(56) References Cited

U.S. PATENT DOCUMENTS

| | | | |
|---|---|---|---|
| 7,015,513 B2 * | 3/2006 | Hsieh | 257/99 |
| 7,112,456 B2 | 9/2006 | Park et al. | |
| 7,268,372 B2 | 9/2007 | Park et al. | |
| 7,358,540 B2 * | 4/2008 | Hsieh et al. | 257/98 |
| 2003/0197205 A1 * | 10/2003 | Marsh et al. | 257/200 |
| 2008/0273562 A1 * | 11/2008 | Hasegawa et al. | 372/44.01 |

FOREIGN PATENT DOCUMENTS

| | | |
|---|---|---|
| JP | 2002-208729 A | 7/2002 |
| JP | 2003-8061 A | 1/2003 |
| JP | 2005-108863 A | 4/2005 |

* cited by examiner

*Primary Examiner* — Howard Weiss
*Assistant Examiner* — Tifney Skyles
(74) *Attorney, Agent, or Firm* — Birch, Stewart, Kolasch & Birch, LLP.

(57) ABSTRACT

In the nitride semiconductor device using the silicon substrate, the metal electrode formed on the silicon substrate has both ohmic contact property and adhesion, so that the nitride semiconductor device having excellent electric properties and reliability is obtained. The nitride semiconductor device includes a silicon substrate (2), a nitride semiconductor layer (10) formed on the silicon substrate (2), and metal electrodes (8, 8') formed in contact with the silicon substrate (2). The metal electrodes (8, 8') has first metal layers (4, 4') which are formed in a shape of discrete islands and in contact with the silicon substrate (2), and second metal layers (6, 6') which are in contact with the silicon substrate (2) exposed among the islands of the first metal layers (4, 4') and are formed to cover the first metal layers (4, 4'). Further, the second metal layers (6, 6') are made of a metal capable of forming ohmic contact with silicon, and the first metal layers (4, 4') are made of an alloy containing a metal and silicon, in which the metal is different than that in the second metal layer (6,6').

14 Claims, 7 Drawing Sheets

NITRIDE SEMICONDUCTOR DEVICE

BACKGROUND OF THE INVENTION

1. Field of the Invention

The present invention relates to a nitride semiconductor device using a silicon substrate and method of manufacturing the nitride semiconductor device, and more particularly, relates to a nitride semiconductor device having an electrode of excellent ohmic contact properties and adhesion with respect to the silicon substrate and method of manufacturing the nitride semiconductor device.

2. Description of the Related Art

A nitride semiconductor device is capable of producing high-output, short-wavelength light and has widely been used for a blue or green LED and for a white LED, in which a fluorescent material is used in combination of a nitride semiconductor device. In addition, a nitride semiconductor device has been intensively studied also as a high-speed electric device such as HEMT.

When manufacturing a nitride semiconductor device, a nitride semiconductor layer is generally grown by heteroepitaxial growth on a foreign substrate such as sapphire, because a GaN substrate for homo-epitaxial growth of a nitride semiconductor layer is expensive. However, obtaining a wafer having a large diameter is difficult even by using a foreign substrate such as sapphire, nor at a lower cost. Also, since sapphire is insulative, an electrode cannot be formed on the back surface of a sapphire substrate and electrodes of different polarities are needed to be formed at the same side of the nitride semiconductor layer. Thus, a uniform current distribution within the nitride semiconductor device is difficult to obtain.

Therefore, consideration has been made about fabrication of a nitride semiconductor component on a silicon substrate, which is conductive and an electrode can be formed on the back surface thereof, and a wafer having a large diameter is available in the market at a lower price.

For example, described in JP 2002-208729A is a nitride semiconductor device fabricated by forming a metal-compound region having gallium, indium and silicon as its major components and an aluminum nitride layer on an n-type silicon substrate, then forming a nitride semiconductor component structure thereon. On the back surface of the n-type silicon substrate, there is formed a cathode electrode made of vacuum-deposited titanium and aluminum. On the p-side of the nitride semiconductor layer, there is formed an anode electrode made of vacuum-deposited nickel and gold. Also described therein is a formation of an electrode made of sequentially stacked titanium/an alloy of gold, germanium and nickel/gold as substitute for the cathode electrode made of titanium and aluminum.

Described in JP 2003-8061A is a nitride semiconductor device in which a layer containing a IIIB group element is formed on an n-type silicon substrate and then a nitride semiconductor layer is formed thereon. On the back surface of the n-type silicon substrate, there is formed a bonding electrode made of any one of Al, Ti, Zr, Hf, V and Nb. On the p-side of the nitride semiconductor layer, there is formed a thin-film transparent electrode made of any one of Ta, Co, Rh, Ni, Pd, Pt, Cu, Ag and Au, and further formed a second bonding electrode.

Further, described in JP 2005-108863A is a nitride semiconductor device in which a nitride semiconductor layer grown on a foreign substrate such as sapphire is bonded to a silicon substrate via a conductive bonding layer such as an eutectic crystal layer, then the foreign substrate such as sapphire is removed to obtain the nitride semiconductor device.

However, when a nitride semiconductor device is formed by using a silicon substrate as described in JP 2002-208729A, JP 2003-8061A, and JP 2005-108863A, a metal electrode formed on the silicon substrate is easy to detach during the manufacturing process of the device. That is, because a silicon substrate is conductive, it is possible to form a metal electrode on the back surface of the substrate, but the silicon substrate and metal electrode are needed to establish good ohmic contact. However, when a metal electrode is made of a metal having a good ohmic contact with a silicon substrate, the metal electrode may detach from the silicon substrate during the manufacturing process of the nitride semiconductor device such as a dicing process. In a nitride semiconductor device, a nitride semiconductor layer having different thermal expansion coefficient and lattice constant is needed to be formed on a silicon substrate. Therefore, stress loaded on the metal electrode formed on the silicon substrate is larger than that in a silicon semiconductor device. Consequently, it is presumed that detachment of the metal electrode is particularly easy to occur.

Particularly, in the cases where the silicon substrate and the nitride semiconductor layer are coupled by bonding as described in JP 2005-18863A, the growth substrate is removed after bonding three layers of a growth substrate, a nitride semiconductor layer, and a silicon substrate, each having a different thermal expansion coefficient. This causes a significant change in the warpage of the silicon substrate during manufacturing process, resulting in increased occurrence of detachment of the metal electrode. In addition, after bonding the silicon substrate and the nitride semiconductor layer by using a conductive bonding layer as described in JP 2005-18863A, annealing cannot be applied at a higher temperature than the melting point of the conductive bonding layer. Thus, the metal electrode formed on a silicon substrate after bonding needs to be made of a metal capable of establishing ohmic contact without being subjected to annealing at a high temperature, limiting the selection of the electrode materials. Therefore, satisfying both ohmic contact property and adhesion in the metal electrode becomes further difficult.

SUMMARY OF THE INVENTION

An object of the present invention is to provide a nitride semiconductor device with excellent electric properties and reliability, by achieving both ohmic contact property and adhesion to a substrate in a metal electrode formed on a silicon substrate in a nitride semiconductor device using a silicon substrate, and a method of manufacturing the same.

To achieve the above-described object, a nitride semiconductor device according to one aspect of the present invention includes a silicon substrate, a nitride semiconductor layer formed on the silicon substrate, and a metal electrode formed in contact with the silicon substrate. The metal electrode has a first metal layer which is in contact with the silicon substrate and is formed in a shape of discrete islands, and a second metal layer which is in contact with the silicon substrate exposed among the islands of the first metal layer and is formed to cover the first metal layer. The second metal layer is made of a metal capable of forming an ohmic contact with silicon, and the first metal layer is made of an alloy containing a metal and silicon, in which the metal is different than that in the second metal layer.

According to the present invention, high adhesion with the silicon substrate can be obtained by the first metal layer while maintaining a good ohmic contact with the silicon substrate by the second metal layer. Thus, a metal electrode excellent in both ohmic contact property and mechanical stability can be easily obtained. That is, in the present invention, the second metal layer is made of a metal such as platinum group metal capable of forming good ohmic contact with silicon. Although adhesion to the silicon substrate is not strong, the second metal layer forms good ohmic contact with the surface of the silicon substrate exposed among the discrete islands of the first metal layer. In contrast, the first metal layer is made of an alloy containing a metal and silicon, in which the metal is different than that in the second metal layer, and has strong adhesion to the silicon substrate. Thus, when the first metal layer is formed in a shape of discrete islands on the silicon substrate, the first metal layer serves as an anchor to connect the silicon substrate and the second metal layer, so that the adhesion of the entire metal electrode can be ensured.

In the present invention, the expression "a metal different than that in the second metal layer" means a metal different than a major component of the second metal layer, but a metal contained in a small amount in the second metal layer is not excluded. Also in the invention, the expression "major component" means a component that is contained in an amount of 50% or more by molar ratio.

The first metal layer is preferably made of an alloy containing a transition metal and silicon, and more preferably, an alloy containing at least one selected from Ti, W, and Co, and silicon. The silicon alloys as described above have a high bonding strength to silicon substrate so that detachment of the metal electrode can be prevented more efficiently.

The first metal layer is for ensuring adhesion to the silicon substrate and ohmic contact is formed between the silicon substrate exposed among the first metal layers and the second metal layer. Therefore, the diameter of the islands of the first metal layer is preferably 100 Å or less. With this arrangement, the ohmic contact area between the second metal layer and the silicon substrate increases and the contact resistance can be further reduced. In addition, the thickness of the first metal layer is preferably in a range from 5 to 100 Å. When the thickness is set as described above, by sputtering, the first metal layer can be formed in a shape of islands each having a microscopic diameter.

When the silicon substrate is of p-type, the second metal layer preferably contain at least one element of platinum group (Ru, Rh, Pd, Os, Ir, and Pt) as a major component, and most preferably contain Pt as a major component. The platinum group metals can easily form ohmic contact with a p-type silicon substrate, and for example, it is possible to form good ohmic contact even when the resistivity is somewhat high. Particularly, Pt can form good ohmic contact even when the resistivity of the p-type silicon substrate is 2 Ω cm or more. Also, the platinum group metals are preferable because if the resistivity of the silicon substrate is somewhat low, e.g. 0.5 Ω cm or less, ohmic contact can be formed without a high temperature annealing.

Further, the silicon substrate and the nitride semiconductor layer are preferably bonded by using a conductive bonding layer. With this arrangement, anti-detachment effect of the present invention becomes more significant.

A method of manufacturing a nitride semiconductor device of the present invention concerns a method of manufacturing a nitride semiconductor device having a silicon substrate, a nitride semiconductor layer formed on the silicon substrate, and a metal electrode formed in contact with the silicon substrate. The method includes a process of forming a metal electrode that includes a step of forming a first metal layer on the silicon substrate so that the first metal layer is in contact with the silicon substrate and is formed in a shape of discrete islands, and a step of forming a second metal layer to be in contact with the silicon substrate exposed among the islands of the first metal layer and to cover the first metal layer, the second metal layer is made of a metal capable of establishing ohmic contact with silicon and the first metal layer is made of an alloy containing a metal and silicon, in which the metal is different than that in the second metal layer.

According to the present method of manufacturing, a first metal layer having a high adhesion to a silicon substrate is formed on a silicon substrate and subsequently, a second metal layer having good ohmic contact property with a metal electrode is formed thereon. Thus, a metal electrode excellent in both ohmic contact property and mechanical stability can be formed.

As described above, according to the present invention, in a nitride semiconductor device using a silicon substrate, a metal electrode formed on the silicon substrate has both ohmic contact property and adhesion so that a nitride semiconductor device having excellent electrical properties and reliability can be provided.

DENOTATION OF NUMERALS

Figure 1A:
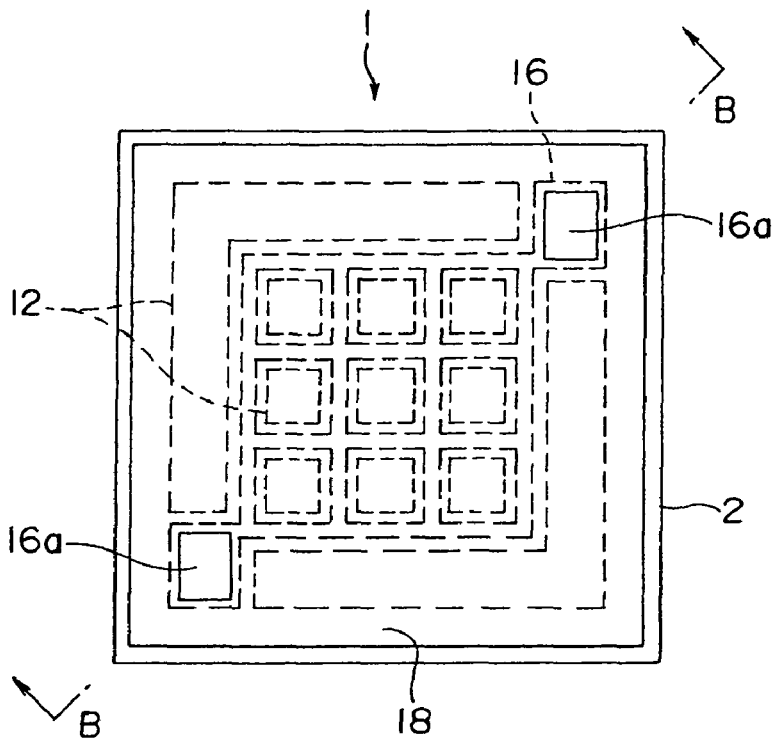
FIG. 1A is a plan view showing an example of a nitride semiconductor device according to the present invention.

1: nitride semiconductor deice
2: silicon substrate
4, 4': first metal layers
6, 6': second metal layers
8, 8': metal electrodes
10: nitride semiconductor layer
12: p-electrode
14: insulating protective film
16: n-electrode
17: conductive bonding layer
18: second insulation protective film
20: growth substrate 22: first main surface (front surface) of silicon substrate
24: second main surface (back surface) of silicon substrate

DETAILED DESCRIPTION OF THE PREFERRED EMBODIMENTS

Figure 1B:
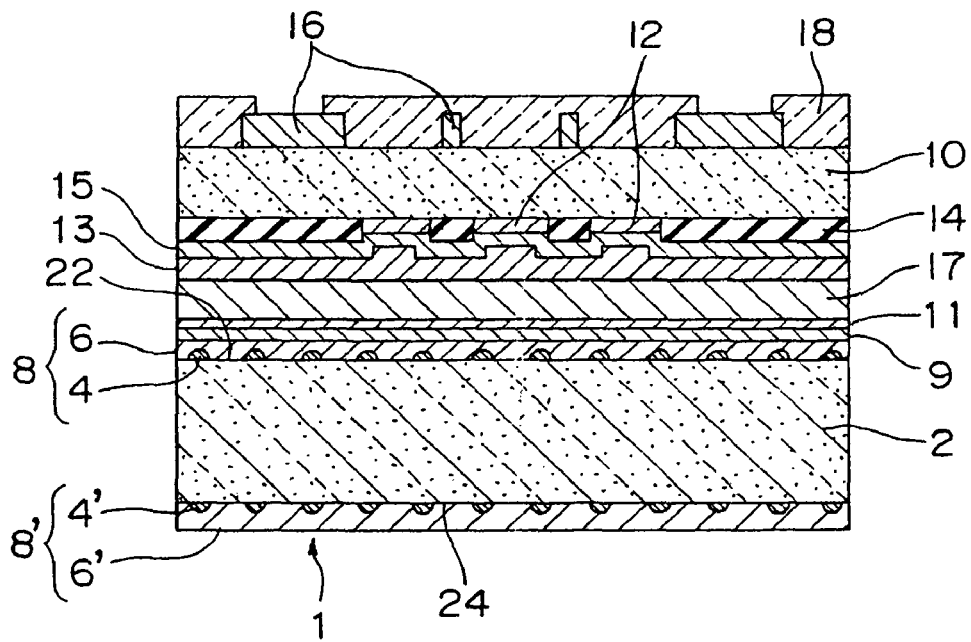
FIG. 1B is a cross-sectional view taken along line B-B' in FIG. 1A.

Now preferred embodiments of the present invention will be described below with reference to attached drawings. FIG. 1A and FIG. 1B are top view and cross-sectional view, respectively, showing a nitride semiconductor device according to the present embodiment. In the nitride semiconductor device 1 shown in FIGS. 1A and 1B, a nitride semiconductor layer 10 is bonded on a front surface (first main surface) 22 of a silicon substrate 2 which is conductive and approximately rectangular, via a metal electrode 8, a substrate-side adhesion layer 9, a substrate-side barrier layer 11, a conductive bonding layer 17, a semiconductor-side barrier layer 13, a semiconductor-side adhesion layer 15, and a p-electrode 12. Further, a metal electrode 8' is also formed on the back surface (second main surface) 24 of the silicon substrate 2. The p-electrode 12 is ohmically connected to the p-side of the nitride semiconductor layer 10, and can be electrically connected to outside via the silicon substrate 2. In addition, an insulating protective film 14 is formed around the p-electrode 12. Meanwhile, an n-electrode 16 is formed at the n-side of the nitride semiconductor layer 10 and covered by a second insulating protective film 18 except a pad portion 16a. The n-electrode 16 can be electrically connected to outside through a wire and the like connected to the pad portion 16a.

The nitride semiconductor device 1 shown in FIG. 1A and FIG. 1B uses a conductive silicon substrate 2 and has the metal electrode 8' on the back surface 24 of the silicon substrate 2, so that electric current can be supplied uniformly throughout the device. In addition, the silicon substrate is inexpensive and it enables the production of the devices at a low cost. Further, the silicon substrate 2 is an inherently easily-diced material, and moreover, detachment of the metal electrodes 8 and 8' during dicing, which has been a problem, is prevented according to the present embodiment, so that high-yield production can be realized.

Figure 2:
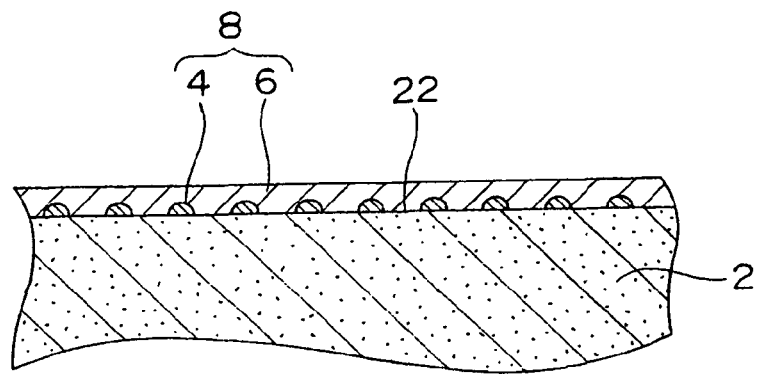
FIG. 2 is a schematic view showing a silicon substrate and a metal electrode.

FIG. 2 is a schematic view showing a part of the metal electrode 8 on the silicon substrate 2. As shown in FIG. 2, in the present embodiment, the metal electrode 8 formed on the front surface 22 of the silicon substrate 2 includes a first metal layer 4 formed into discrete islands, and a second metal layer 6 covering the first metal layer 4 and planarly formed on the substantially entire surface of the silicon substrate 2. The second metal layer 6 is made of a metal such as platinum group metal capable of forming good ohmic contact with silicon, and ohmically connected to the front surface 22 of the silicon substrate 2 which is exposed among the discrete islands of the first metal layer 4. In contrast, the first metal layer 4 is made of an alloy containing a metal and silicon, in which the metal is different than that in the second metal layer 6, and strongly adheres to the silicon substrate 2. The first metal layer 4 serves as an anchor to connect the silicon substrate 2 and the second metal layer 6. Therefore, with the metal electrode 8 of the present embodiment, detachment of the second metal layer 6 from the silicon substrate 2 can be prevented efficiently due to anchor effect of the first metal layer 4, while securing good ohmic contact with the silicon substrate 2 by the second metal layer 6. In addition, it is also preferable that the metal electrode 8' formed on the back surface 24 of the silicon substrate 2 has the same composition and structure as that of the metal electrode 8 on the surface. The following description on the metal electrode 8 can also be applied to the metal electrode 8'.

Figure 3:
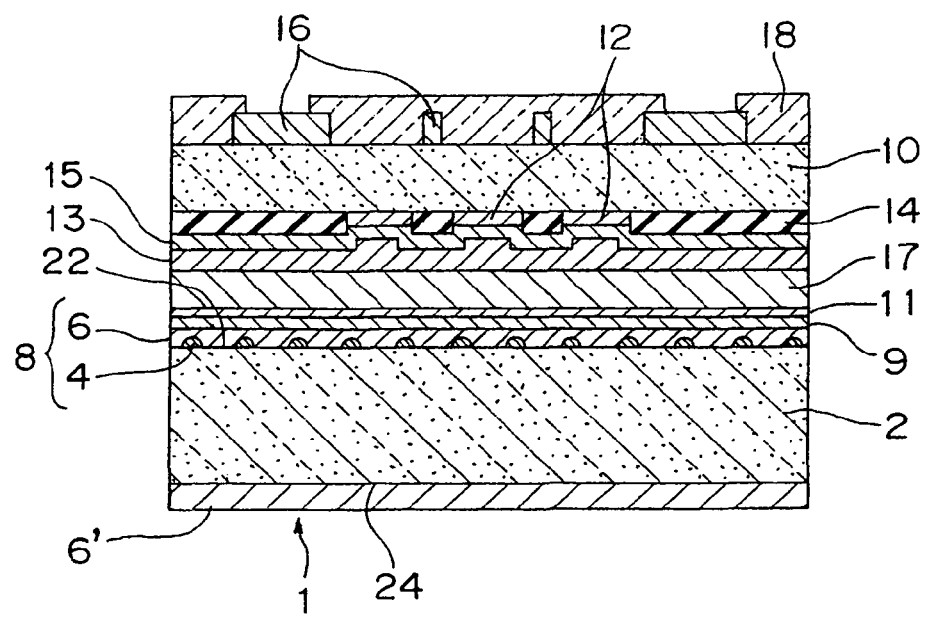
FIG. 3 is a cross-sectional view showing a first variation of the nitride semiconductor device.

It is preferable that if a metal electrode 8 having a first metal layer 4 and a second metal layer 6 is disposed on the front surface 22 of the silicon substrate 2 as shown in FIG. 3, detachment of the metal electrode 8 at the time of dicing can be prevented. That is, detachment between the silicon substrate 2 and the nitride semiconductor 10 can be prevented. Further, ohmic contact between the front surface 22 of the silicon substrate 2 and the metal electrode 8 can also be securely formed.

Figure 4:
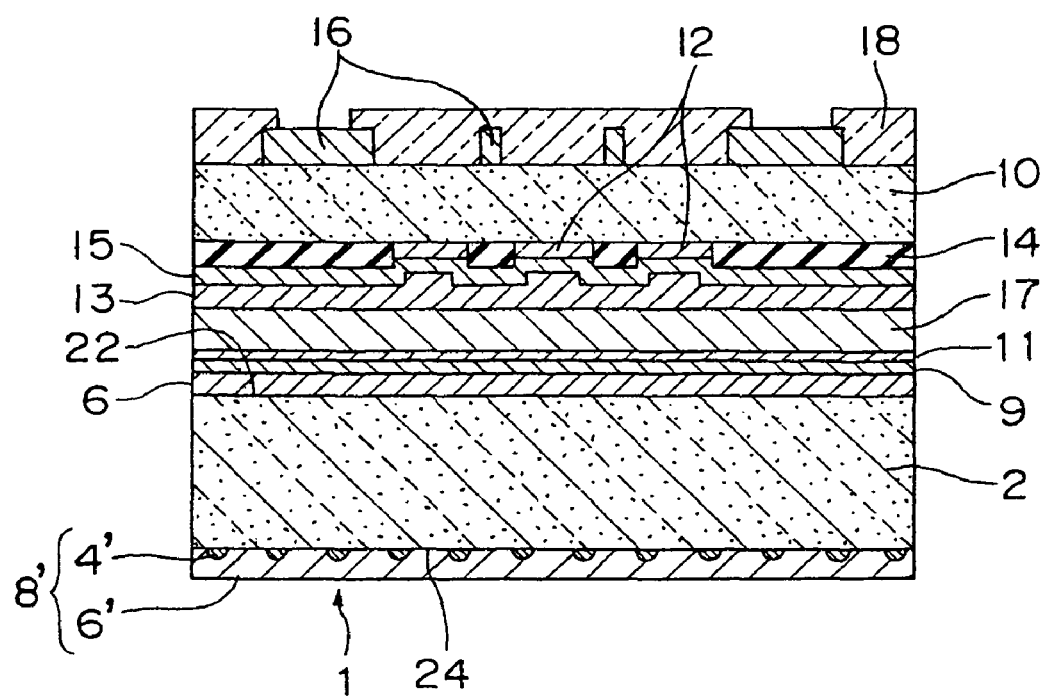
FIG. 4 is a cross-sectional view showing a second variation of the nitride semiconductor device.

Similarly, It is preferable that if a metal electrode 8' having a first metal layer 4' and a second metal layer 6' is disposed on the back surface 24 of the silicon substrate 2 as shown in FIG. 4, detachment of the metal electrode 8' at the time of dicing can be prevented. Further, ohmic contact between the surface 24 of the silicon substrate 2 and the metal electrode 8' can also be established.

It is most preferable if the metal electrodes 8, 8' are disposed on both the front surface 22 and the back surface 24 of the silicon substrate 2 as shown in FIG. 2. With this arrangement, both the front surface 22 and the back surface 24 of the silicon substrate 2 can be provided with the metal electrode 8, 8' having excellent ohmic contact property and adhesion.

The first metal layer 4 contains a metal and silicon in which the metal is different than that in the second metal layer 6. A silicon alloy generally has high adhesion to silicon, so that the first metal layer 4 has a high adhesion to the silicon substrate. In addition, silicon alloy also has higher adhesion than that of silicon to a metal such as a platinum metal having excellent ohmic contact property with silicon. Further, mechanical adhesion between the first metal layer 4 and the second metal layer 6 can also be obtained by enclosing the periphery of the first metal layer 4 formed in a shape of discrete islands with the second metal layer 6. Thus, when the first metal layer 4 is formed in a shape of discrete islands on the silicon substrate 2, the first metal layer 4 serves as an anchor to connect the silicon substrate 2 and the second metal layer 6, so that the detachment of the entire metal electrode 8 can be prevented effectively.

Herein, the silicon alloy expressed herein as "alloy containing a metal and silicon, in which the metal is different from that in the second metal layer" is not specifically limited, as long as the alloy can strongly adhere to the silicon substrate 2. "Metal different than that in the second metal layer" is, however, preferably a transition metal, and more preferably, one selected from the group consisting of Ti, Co, W, and Ni. Among them, Ti, Co, or W is preferable and Ti is most preferable. These silicon alloys show high connection strength to the silicon substrate 2. In addition, the silicon content in the first metal layer 4 is preferably 40 to 75 atom %. When the silicon content is less than 40 atom %, the connection strength with the silicon substrate 2 is likely to decrease. When the silicon content is higher than 75 atom %, the anchor effect of the first metal layer 4 to the second metal layer 6 is likely to decrease. The expression "alloy" in the present specification means a material made by adding and melting a different metal element or non metal element to a metal, and includes silicide. It is further preferable if the first metal layer 6 is silicide. Particularly, $TiSi_2$ is most stable silicide and therefore preferable.

On the other hand, the second metal layer 6 is made of a metal capable of forming good ohmic contact with silicon. When the silicon substrate 2 is of p-type, the second metal layer 6 is preferably made of a metal having a large work function. For example, the second metal layer 6 is preferably made of a platinum group metal (Ru, Rh, Pd, Os, Ir, or Pt), and most preferably Pt. Platinum group metals can easily form ohic contact with a p-type silicon substrate 2, and for example, a good ohmic contact can be formed even when the resistivity of the silicon substrate is somewhat high. Particularly, Pt is capable of forming good ohmic contact even when the resistivity of the p-type silicon substrate 2 is 2 Ωcm or greater. In addition, when the resistivity of the p-type silicon substrate 2 is somewhat low, a platinum group metal can form ohmic contact without a high temperature annealing. On the other hand, when the silicon substrate is of n-type, a metal containing Ti or Al as a main component is preferable, and Ti or Al is more preferable. In addition, the second metal layer 6 needs to be made of a metal capable of forming good ohmic contact as a whole. For example, a platinum metal may contain another metal element to a degree that does not impair its ohmic contact property.

If the anchor effect due to the first metal layer 4 can be obtained, the first metal layer 4 and the second metal layer 6 are not necessarily in contact with each other. For example, a third metal layer, which can adhere tightly to the both the first metal layer 4 and the second metal layer 6, may be interposed therebetween.

The metal electrode 8 may be formed as below. First, the first metal layer 4 is grown in a shape of discrete islands on the silicon substrate 2. The first metal electrode 4 can be formed in a shape of islands by way of patterning using photolithography, but a shape of islands is preferably formed by using sputtering or vacuum deposition, and particularly, sputtering is preferable. That is, in sputtering, island-shaped cores are formed in a cluster in the initial stage of growing. As the growth proceeds, the clusters joined each other to form an uniform film. Therefore, if the sputtering is stopped before the uniform film is grown, the first metal layer 4 of discrete islands each having a microscopic diameter can be formed. Then, the second metal layer 6 is formed to cover the first metal layer 4 formed in the shape of discrete islands. The second metal layer 6 can be formed by using a conventional method such as sputtering and vacuum deposition. Thus, the metal electrode 8 is formed on the silicon substrate 2.

The first metal layer 4 is to secure the adhesion to the silicon substrate 2, and ohmic contact is formed between the silicon substrate 2 and the second metal layer 6 which is exposed among the first metal layer 4. Therefore, the diameter of each island of the first metal layer 4 is preferably 100 Å or less. With this arrangement, the ohmic contact area between the second metal layer 6 and the silicon substrate 2 increases and the contact resistance therebetween further decreases. In addition, an average pitch of the islands, i.e., a distance between each island, of the first metal layer 4 is preferably equal to or larger than the mean diameter of the islands. The thickness of the first metal layer 4 is preferably in a range from 5 to 100 Å and more preferably in a range from 10 to 50 Å. With this thickness, it is possible to form the first metal layer 4 with a fine pitch islands each having a microscopic diameter, by using the cluster formation in sputtering. On the other hand, the second metal layer 6 is formed to at least completely cover the first metal layer 4. The thickness of the second metal layer 6 is preferably 2000 to 5000 Å, more preferably in a range from 2500 to 3000 Å.

The first metal layer 4 made of a silicon alloy is preferably formed by sputtering using a target made of a silicon alloy having an intended composition. Accordingly, the density of the silicon substrate 2 can be maintained substantially constantly even in the vicinity of the interface with the metal electrode 8. For example, in a case where a silicon alloy having the composition $TiSi_2$ is formed as the first metal layer 4, it is possible that Ti is formed in island shape and then annealing is performed to obtain $TiSi_2$. However, the silicon contained in the silicon substrate 2 is consumed to form a silicon alloy, so that the density of the silicon substrate 2 decreases in the vicinity of the interface with the metal electrode 8. On the other hand, in a case where the first metal layer 4 is formed by sputtering using $TiSi_2$ as the target, the density of the silicon substrate 2 can be maintained also in the vicinity of the interface with the metal electrode 8. Thus, it is preferable if the density of the silicon substrate 2 is substantially constant in the vicinity of the interface with the metal electrode 8, the ohmic contactivity and adhesion between the silicon substrate 2 and the metal electrode 8 can be more improved.

(Method of Manufacturing Nitride Semiconductor Device 1)

Next, a method of manufacturing the nitride semiconductor device 1 will be described with reference to FIGS. 5A to 5H. For illustrative purpose, the patterns of the p-electrode 12 and the n-electrode 16 are simplified in FIGS. 5A to 5H.

Figure 5A:
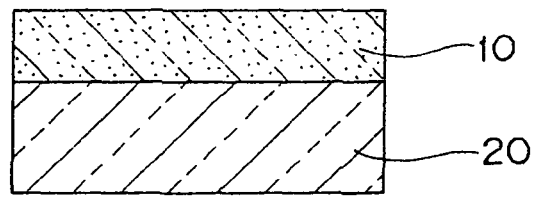
FIG. 5A is a sectional view illustrating a part of a manufacturing process of a nitride semiconductor device.

As shown in FIG. 5A, the nitride semiconductor layer 10 is formed on the surface of the growth substrate 20 made of sapphire and the like. The nitride semiconductor layer 10 is formed by stacking a plurality of n-type and p-type nitride semiconductor layers to realize an appropriate device structure. In view of crystallinity, it is preferable to grow the p-type nitride semiconductor layer after growing the n-type nitride semiconductor layer. For example, in the case of a nitride semiconductor light emitting device, the device structure includes a buffer layer, a high-temperature growth layer, an n-cladding layer, an active layer, a p-type cladding layer, and a p-type contact layer and the like.

Figure 5B:
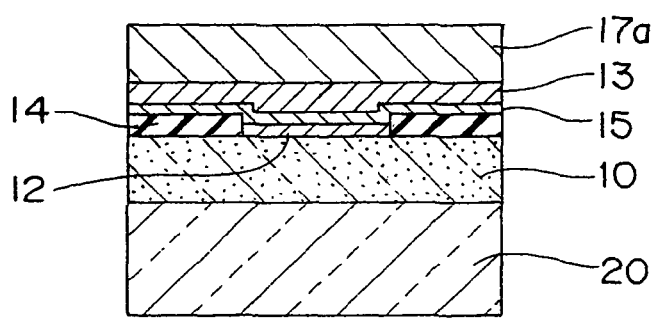
FIG. 5B is a cross sectional view illustrating a following process of FIG. 5A.

Next, as shown in FIG. 5B, the p-electrode 12 is formed to ohmically connect to the p-side surface of the nitride semiconductor layer 10. For example, Rh and the like can be used for the p-electrode 12. Then, the insulating protective film 14 such as $SiO_2$ is formed around the p-electrode 12, and the semiconductor side of the adhesion layer 15 such as Ti, the semiconductor side of the barrier layer such as Pt 13, and the first conductive bonding layer 17a are sequentially formed from the nitride semiconductor layer 10 side to cover the entire surface of the device. The first conductive bonding layer 17a contains a relatively low melting point metal such as Sn, In as its main component. In addition, it is preferable to dispose an Au layer (not shown) at the interface of exposed surface of the first conductive bonding layer 17a and/or at the interface between the first conductive bonding layer 17a and the semiconductor side of the barrier layer 13. The Au layer protects the first conductive bonding layer 17a and further improves the bonding.

Figure 5C:
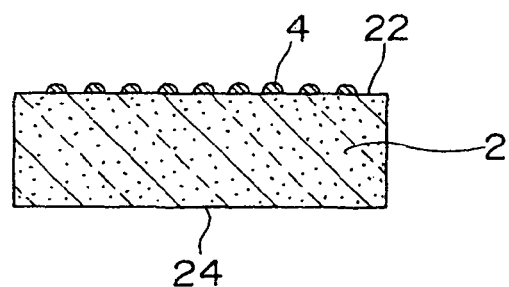
FIG. 5C is a cross sectional view illustrating a following process of FIG. 5B.

Next, as shown in FIG. 5C, the p-type (or n-type) silicon substrate 2 is prepared, and thereon, the first metal layer 4 made of a silicon alloy such as $TiSi_2$ is formed in a shape of discrete islands. The first metal layer 4 is preferably formed by sputtering using an appropriate silicon alloy target. That is, the sputtering is stopped before a uniform film is obtained so that the first metal layer 4 can be formed in a shape of discrete islands.

Figure 5D:
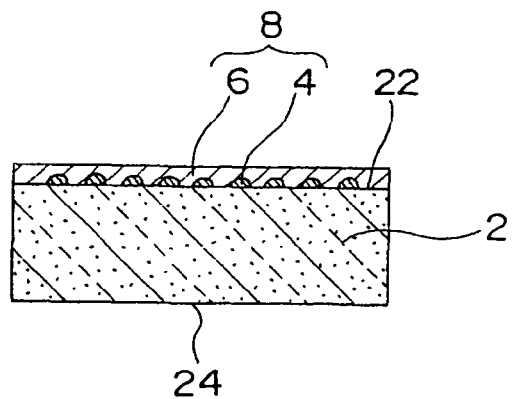
FIG. 5D is a cross sectional view illustrating a following process of FIG. 5C.

Next, as shown in FIG. 5D, a second metal layer 6 made of Pt and the like is formed to cover the first metal layer 4 formed in a shape of discrete islands. The second metal layer 6 can be formed by using a conventional method such as sputtering and vacuum deposition. Thus, a metal electrode 8 is formed on the silicon substrate 2.

Figure 5E:
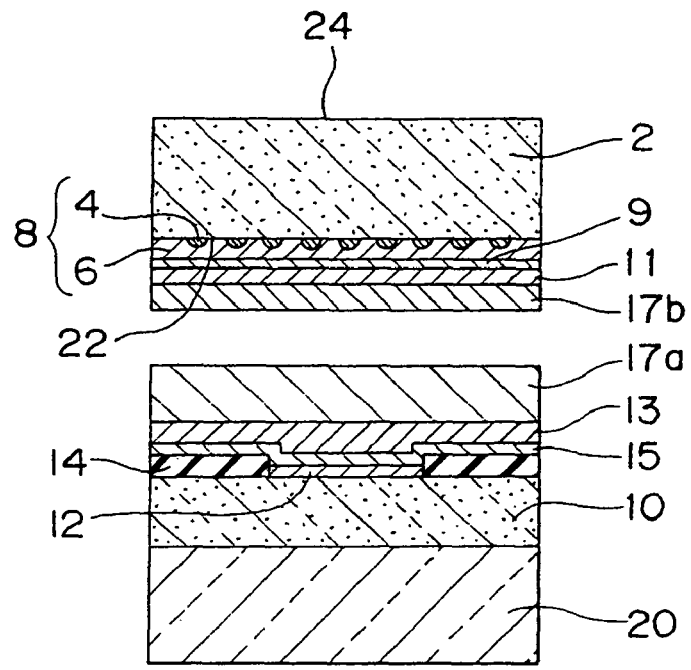
FIG. 5E is a cross sectional view illustrating a following process of FIG. 5D.

Next, as shown in FIG. 5E, on the silicon substrate 2, a substrate side of adhesion layer 9, a substrate side of barrier layer 11, and a second conductive bonding layer 17b are further formed, then the silicon substrate 2 is turned upside down. The second conductive bonding layer 17b is made of Pd, Au and the like and is capable of forming an eutectic crystal with the first conductive bonding layer 17a. The second conductive bonding layer 17b contains a metal having a higher melting point than that of the first conductive bonding layer 17a as a main component. The silicon substrate 2 is stacked on the nitride semiconductor layer 10 so that the first conductive bonding layer 17a and the conductive bonding layer 17b are placed facing each other, then, heat pressure welding is carried out. The substrate side of the adhesion layer 9 and the substrate side of the barrier layer 11 are not necessarily needed or can be omitted. In addition, the materials for the first conductive bonding layer 17a and the second conductive bonding layer 17b are preferably selected from a combination of materials which have good wettability to each other and interdiffuse with each other. For example, combinations such as Au and Sn, Sn and Pd, Ag and Sn have good wettability to each other and interdiffuse with each other. Therefore, for example, it is possible to form the first conductive bonding layer 17a with Au—Sn alloy and the second conductive bonding layer 17b with Au or Pd.

Figure 5F:
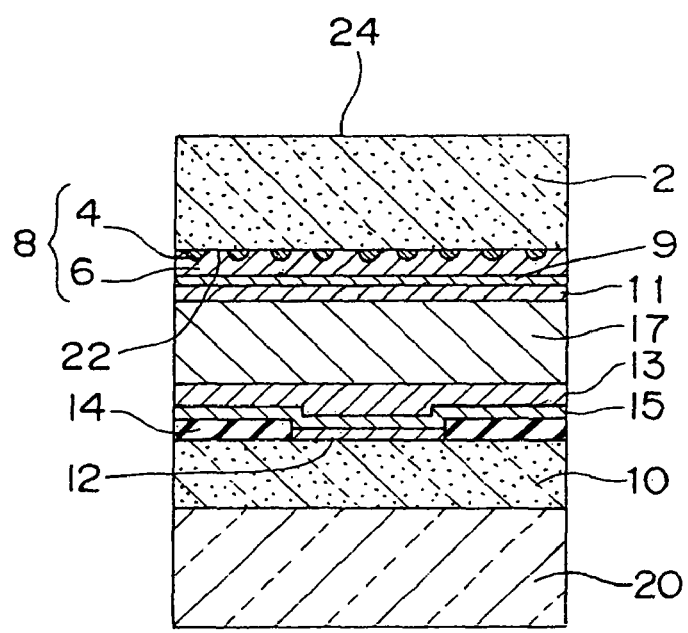
FIG. 5F is a cross sectional view illustrating a following process of FIG. 5E.

As shown in FIG. 5F, when heat-pressed, the first conductive bonding layer 17a and the second conductive bonding layer 17b interdiffuse into each other to form a conductive bonding layer 17, so that the silicon substrate 2 and the nitride semiconductor layer 10 are bonded.

Figure 5G:
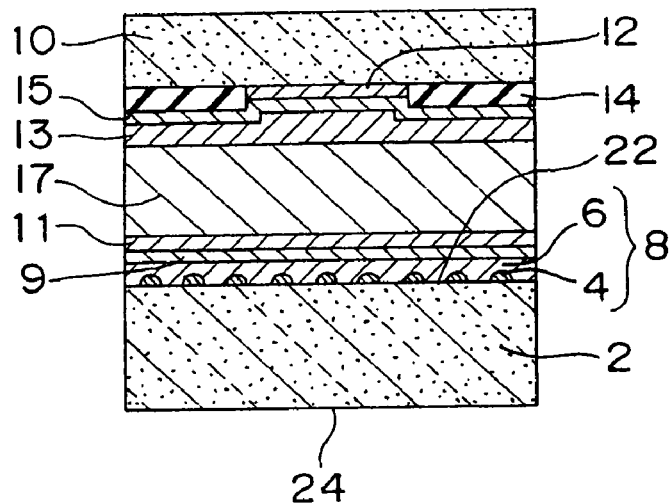
FIG. 5G is a cross sectional view illustrating a following process of FIG. 5F.

Then, as shown in FIG. 5G, the device is turned upside down with the silicon substrate 2 is on the downside, and is placed into a polishing machine and wrapping of the growth substrate 20 is carried out. With this operation, the buffer layer and the underlayer in the nitride semiconductor layer 10 can also be removed.

Figure 5H:
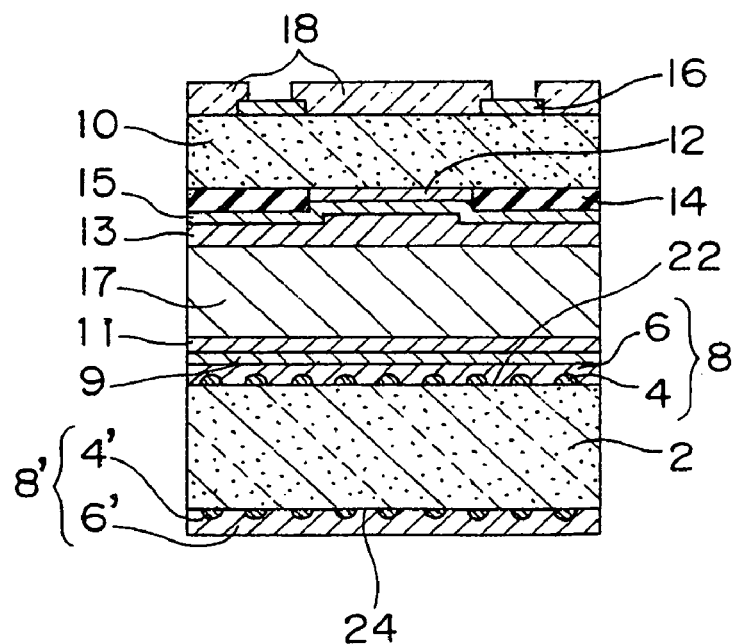
FIG. 5H is a cross sectional view illustrating a following process of FIG. 5G.

Next, as shown in FIG. 5H, after polishing the n-side surface of the nitride semiconductor layer 10, the n-electrode 16 of such as Ti/Al/Ni/Au is formed thereon and the surface is covered with the second insulating film 18 except the pad portion. Next, on the back surface 24 of the silicon substrate 2, the first metal layer 4' made of $TiSi_2$ and the like is disposed in a shape of discrete islands, and the second metal layer 6' made of Pt and the like is formed to cover the first metal layer 4'. Thus, the metal electrode 8' is formed. At this time, if a high temperature greater than the melting point of the conductive bonding layer 17 is applied to the nitride semiconductor device, the silicon substrate 2 may detach from the nitride semiconductor layer 10. If the second metal layer 6 is made of Pt and the like, for example, the metal electrode 8' of the present embodiment is capable of forming ohmic contact without performing a high temperature annealing. Therefore, the metal electrode 8' with good ohmic contact property can be formed without causing difficulties such as detachment of the silicon substrate 2.

In addition, the back surface 24 of the silicon substrate 2 may be polished before forming the first metal layer 4' and the second metal layer 6'. This enables to form a thin silicon substrate 2, so that a thin nitride semiconductor device can be obtained. Particularly, it is preferable when the thickness of the silicon substrate 2 is in a range from 50 µm to 250 µm, a thin nitride semiconductor device can be obtained while securing a necessary thickness so as to serve as a substrate for the nitride semiconductor device 2.

In order to reduce the thickness of the silicon substrate 2, it is preferable to polish the back surface 24 of the silicon substrate 2 after bonding the nitride semiconductor layer 10 to the silicon substrate 2. Polishing of the silicon substrate 2 before bonding the nitride semiconductor layer 10 thereto is undesirable. Because a thin silicon substrate 2 has a low mechanical strength and polishing of the silicon substrate 2 before bonding the nitride semiconductor layer 10 may damage the silicon substrate 2. Further, if the thickness of the silicon substrate is reduced before bonding with the nitride semiconductor layer, the silicon substrate tends to be damaged due to difference in thermal expansion coefficient between the silicon substrate and the nitride semiconductor layer. Particularly, when the thickness of the silicon substrate 2 is reduced to 250 µm or less, possibility of damage caused by the above is increased. Therefore, polishing the back surface 24 of the silicon substrate 2 after bonding the silicon substrate 2 with the nitride semiconductor layer 10 enables to obtain a thin silicon substrate 2 without damaging the silicon substrate 2.

Figure 6:
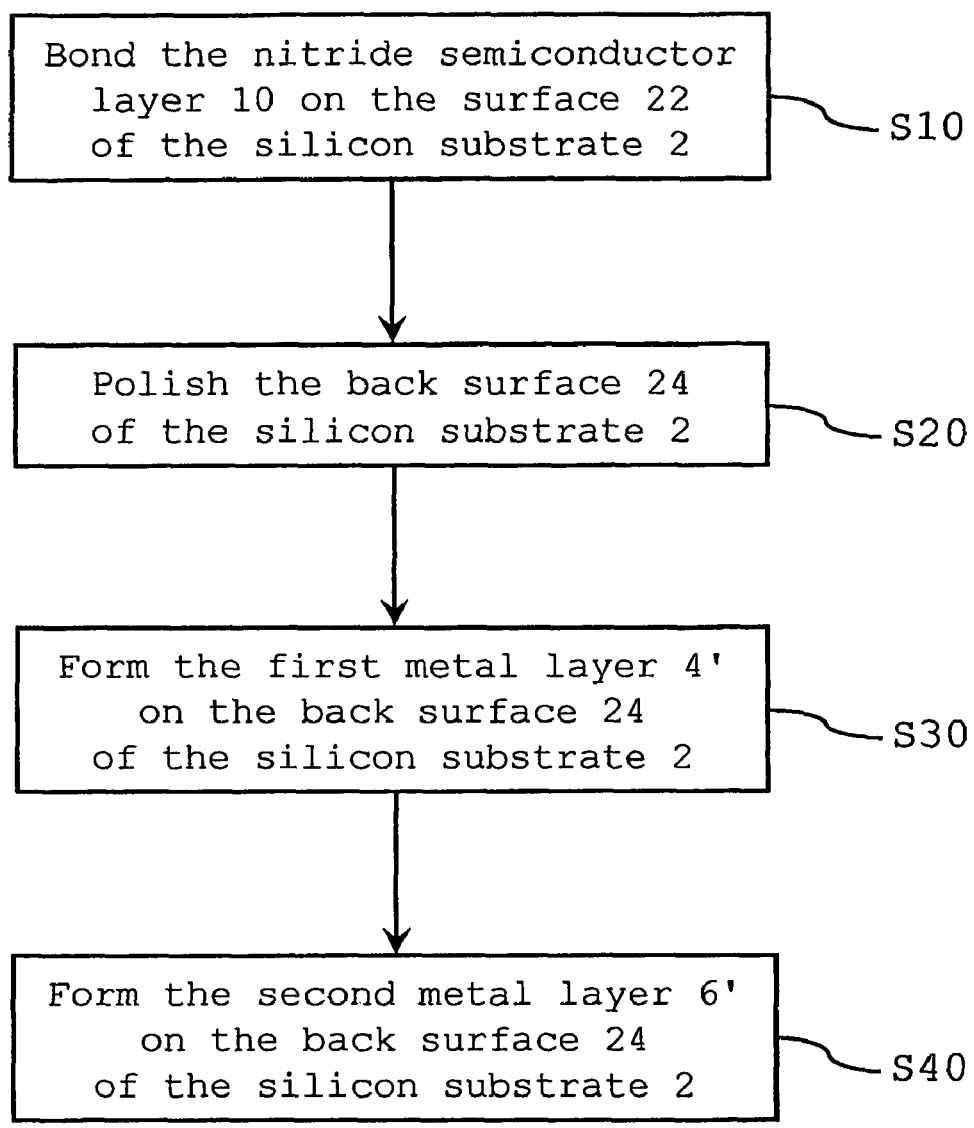
FIG. 6 is a flow chart illustrating a part of a manufacturing process of a nitride semiconductor device.

In addition, as shown in the flow-chart of FIG. 6, when polishing the back surface 24 of the silicon substrate 2, the metal electrode 8' of the back surface 24 is needed to be disposed after the polishing process S20. That is, the process of forming the metal electrode 8 (the process S30 of forming the first metal layer 4' and the process of forming the second metal layer 6') is needed to be performed after the process of bonding the silicon substrate 2 and the nitride semiconductor layer 10. The metal electrode 8' of the present embodiment is capable of forming ohmic contact without performing a high temperature annealing. Therefore, even if the metal electrode 8' is disposed after bonding the silicon substrate 2 and the nitride semiconductor layer 10, the metal electrode 8' having good ohmic contact property can be formed without causing detachment and the like between the silicon substrate 2 and the nitride semiconductor layer 10.

Then, the light emitting device is divided into chips by dicing. Thus, obtained are the nitride semiconductor devices each having the structure in which the nitride semiconductor layer 10 is formed on the silicon substrate 2 and the n-electrode 16 and the p-electrode 12 are formed so as to place the semiconductor layer 10 in between. At this time, a force such as stress and shock that may cause detachment is applied to the metal substrates 8, 8' of the silicon substrate 2. However, the metal electrodes 8, 8' of the present embodiment have excellent adhesion, so that detachment from the silicon substrate 2 can be prevented efficiently.

Next, structures and manufacturing process of the major components of a nitride semiconductor device of the present embodiment will be described in further detail.

(Silicon Substrate 2)

The silicon substrate 2 bonding to the nitride semiconductor layer 10 may be of either n-type or p-type. The conductivity of the silicon substrate 2 is preferably in a range from 0.002 to 3 Ωcm. The conductivity (and the dopant concentration) of the silicon substrate 2 in this range facilitates forming ohmic contact with the metal electrodes 8, 8' and a nitride semiconductor device with a low Vf can be obtained. A p-type silicon substrate can be made p-type by, for example, B-doping, so that inexpensive CZ method can be employed. The resistivity of the p-type silicon substrate can also be controlled easier than in the n-type silicon substrate.

(Substrate-Side Adhesion Layer 9, Semiconductor-Side Adhesion Layer 15)

Adhesion layers such as the substrate-side adhesion layer 9 and the semiconductor-side adhesion layer 15 are to secure a high adhesion with the underlayer and preferably contain at least one metal of Ti, Ni, W, and Mo. The thickness of the adhesion layer is preferably in a range from 50 to 500 nm.

(Substrate-Side Barrier Layer 11, Semiconductor-Side Barrier Layer 13)

A barrier layer such as the substrate-side barrier layer 11 and the semiconductor-side barrier layer 13 is to prevent diffusion of metal from the conductive bonding layer 17, and preferably containing a metal such as a platinum-group metal (Ru, Rh, Pd, Os, Ir, Pt), Ti, Ni, and W. Among platinum-group metals, Pt, Pd, and Rh are preferable, and Pt or Pd is particularly preferable. Pd is most preferable. In the barrier layer, diffusion of metal may be prevented by using a material which is either intermixable or not intermixable with the conductive bonding layer 17. An example of the former is a platinum-group metal, Ti, and Ni, and an example of the latter is W. The thickness of the barrier layer is preferably in a range from 100 to 1000 nm. The adhesion layer and/or the barrier layer can be omitted according to the structure of the nitride semiconductor device.

(First Conductive Bonding Layer 17a)

The first conductive bonding layer 17a contains a metal having a relatively low melting point as its main component. The metal preferably has a melting point of 300° C. and below and is capable of forming a eutectic crystal with the second conductive bonding layer 17b which will hereinafter be described. For example, Sn or In is preferable and Sn is particularly preferable. The thickness of the first conductive bonding layer 17a is preferably in a range from 1000 to 3000 nm.

(Au Layer (Not Shown))

In addition, in order to prevent oxidation of the first conductive bonding layer 17a, it is preferable to form a metal layer having melting point being higher than that of the first conductive bonding layer 17a and lower than that of the second conductive bonding layer 17b, for example, an Au layer, on the first conductive bonding layer 17a. The Au layer is preferably disposed also between the semiconductor-side barrier layer 13 and the first conductive bonding layer 17a, to further prevent diffusion of the first conductive bonding layer 17a into the semiconductor-side adhesion layer and the like.

(Second Conductive Bonding Layer 17b)

The second conductive bonding layer 17b contains a metal having a relatively high melting point as its main component. As the second conductive bonding layer 17b, a metal which is capable of forming a eutectic crystal with the first conductive bonding layer 17a and having a higher melting point than that of the first conductive bonding layer is selected. For example, the second conductive bonding layer 17b is preferably made of Pd or Au, and particularly, Pd is more preferable. The thickness of the second conductive bonding layer 17b is preferably 500 nm or below, more preferably 350 nm or below.

The present embodiment illustrates an example in which the first conductive bonding layer 17a is formed at the nitride semiconductor layer 10 side and the second conductive bonding layer 17b is formed at the silicon substrate 2 side, but a structure having a reverse construction may be employed. The above described is also applicable in situ in that case, if the nitride semiconductor layer and the silicon substrate are considered interchanged each other.

(Nitride Semiconductor Layer 10)

The nitride semiconductor layer 10 is represented by general formula $Al_aIn_bGa_{1-a-b}N$ ($0 \leq a \leq 1$, $0 \leq b \leq 1$, $a+b \leq 1$) and may have various structures according to the type of the device. For example, in the case of the nitride semiconductor device, it is preferable to at least include one or more p-type nitride semiconductor layers, an active layer having a quantum well structure at least including a well layer of $Al_aIn_bGa_{1-a-b}N$ ($0 \leq a \leq 1$, $0 \leq b \leq 1$, $a+b \leq 1$) and a barrier layer of $Al_cIn_dGa_{1-c-d}N$ ($0 \leq c \leq 1$, $0 \leq d \leq 1$, $c+d \leq 1$), and one or more an n-type nitride semiconductor layers.

(p-Electrode 12)

The p-electrode 12 preferably form ohmic contact with the p-type nitride semiconductor layer and have a high reflectivity. A metal material which contain at least a metal selected from the group consisting of Ag, Rh, Ni, Au, Pd, Ir, Ti, Pt, W, and Al is preferably used for the p-electrode 12. One of Rh, Ag, nickel-gold, Ni/Au/RhO and Rh/Ir is preferable, and Rh is more preferable. The p-electrode 12 is formed on the p-type nitride semiconductor layer which has a higher resistivity than that of the n-type nitride semiconductor layer so that the p-electrode 12 is preferably disposed over substantially entire surface of the p-side of the nitride semiconductor layer. In addition, the thickness of the p-electrode 12 is preferably in a range from 0.05 to 0.5 μm.

An opening is defined in the p-electrode 12 which is in contact with the nitride semiconductor 10 and the insulating protective film 14 is disposed in the opening. A single-film or multi-film of $SiO_2$, $Al_2O_3$, $ZrO_2$, $TiO_2$ and the like can be used for the material of the insulating protective film 14. Use of the insulating protective film 14 enables to prevent occurrence of a short circuit and the like, so that process yield and reliability can be improved. The insulating protective film 14 may form a two-layer structure with a reflective film (not shown). For example, when a reflective film (not shown) made of Al, Ag, or Rh, or the like is formed with a thickness in a range from 500 Å to 2000 Å, at a side of the insulating protective film 14 which is not in contact with the nitride semiconductor 10, light traveling in a lateral direction can be extracted efficiently. The reflective film may be provided on either the silicon substrate 2 side or the nitride semiconductor 10 side.

(n-Electrode 16)

A multi-layer electrode of Ti/Al/Ni/Au or W/Al/W/Pt/Au may be used as the n-electrode 16 formed on the n-side of the nitride semiconductor layer 10. The thickness of the n-electrode 16 is preferably in a range from 0.1 to 1.5 μm. In addition, a second insulating protective film 18 such as $SiO_2$, $Al_2O_3$, $ZrO_2$, or $TiO_2$ is preferably formed to cover the exposed surface except for the n-electrode.

In addition, as shown in FIGS. 1A and 1B, the n-electrode 16 has a pad portion 16a at each diagonal corner on a diagonal line across the chip portion and expands in a net shape between the pad portions 16a. When the n-electrode 16 is formed in a shape such as a net shape or a grid shape on the substantially entire surface of the light emitting region, the electric current can be supplied uniformly to the nitride semiconductor layer 10. The pad portions 16a may be formed not only at two corners on the diagonal line but also at all of the four corners. The p-electrode 12 and the n-electrode 16 are preferably arranged alternately at the opposite sides with respect to the nitride semiconductor layer 10 in cross-sectional view. With this arrangement, emitted light can be extracted effectively without being interrupted by the n-electrode 16.

(Growth Substrate 20)

Examples of the growth substrate for growing the nitride semiconductor layer 10 include sapphire having any of C-plane, R-plane, and A-plane as a main surface, spinel (an insulating substrate of such as $MgAl_2O_4$), SiC, Si and an oxide substrate having lattice conformity with that of the nitride semiconductor. Sapphire and spinel are preferable.

(Removal Process of Growth Substrate 20)

Polishing, etching, electromagnetic irradiation, or a combined method thereof can be used to remove the growth substrate 20 after bonding the silicon substrate 2. When electromagnetic irradiation is used, a laser, for example, is used as an electromagnetic radiation source. After bonding the silicon substrate 2, laser is irradiated onto the entire surface of the growth substrate 20 except the portion where the underlayer is formed, then, the underlayer is decomposed. Thus, the growth substrate and the underlayer can be removed. The work can be simplified and process yield can be improved by using electromagnetic irradiation, compared with a method by polishing. Further, after the growth substrate and the underlayer are removed, CMP is performed on the exposed surface of the nitride semiconductor layer to expose a desired layer. With this, a damaged layer can be removed and thickness and surface roughness of the nitride semiconductor layer can be adjusted.

After the growth substrate 20 is removed, projected and recessed part (dimples) may be formed by RIE on the exposed surface of the nitride semiconductor layer 10 to improve light extraction efficiency. The projected and recessed part (dimples) forming portion is situated at the light extracting side of the nitride semiconductor. The angle of light can be changed by the projected and recessed face. Therefore, it becomes possible to extract light that underwent total reflection and was confined within the device. That is, emitted light is diffusely reflected by the projected and recessed part, so that light that had undergone total reflection can be directed upwardly to be extracted outside the device. With the projected and recessed part, an improvement in the output power which is 1.5 times or more higher than that of a device without having the projected and recessed part is expected. The planar shape of the projected and recessed part is preferably circular or polygonal such as hexagonal and triangular. In addition, the planar configuration of the projected and recessed part may be a stripe, a grid, rectangles, or the like.

(Fluorescent Material)

When the nitride semiconductor device is a light emitting device, light of various wavelengths can be emitted by forming a coating layer or a sealing member which contains a fluorescent material capable of absorbing a part or the whole of light emitted from the active layer and emitting light having a different wavelength than that of absorbed light. The fluorescent material preferably absorbs a part of emission from the active layer and converts it into light having a longer wavelength so that together with the light from the active layer, a white light can be emitted.

In the present embodiment, a case in which a stacked layer of a nitride semiconductor is bonded on a silicon substrate is illustrated, but the present invention is not limited thereto. An example may be such that a stacked layer of a nitride semiconductor is grown directly on a silicon substrate and the electrode of the substrate side described above is formed on the back surface of the silicon substrate.

EXAMPLE 1

In the present example, the present invention is applied to a light emitting diode having an emission wavelength of 375 nm, and according to the method shown in FIGS. 5A to 5F, a nitride semiconductor device having a structure shown in FIGS. 1A and 1B is fabricated.

(Growth Substrate)

A substrate made of sapphire (C-plane) was used as a growth substrate 20 and surface cleaning was carrier out at 1050° C. in hydrogen atmosphere in a MOOCVD reaction vessel.

(Underlayer)

Buffer layer: Successively, a buffer layer of GaN of about 200 Å in thickness was grown on the substrate at 510° C. in hydrogen atmosphere by using ammonia and TMG (trimethylgallium).

High temperature grown layer: After the buffer layer was grown, only TMG was stopped and the temperature was raised to 1050° C., then a high temperature grown nitride semiconductor 4 of undoped GaN was grown to a thickness of 5 μm by using TMG and ammonia as source gases.

(n-Type Cladding/Contact Layer)

Next, an n-type cladding layer of n-type $Al_{0.18}Ga_{0.82}N$ doped with Si in a concentration of $5\times10^{17}/cm^3$ was grown to a thickness of 400 Å by using TMG, TMA, ammonia, and silane at 1050° C.

(Active Layer 6)

Next, at the temperature of 800° C. and using TMI (trimethylindium), TMG, and TMA as source gases, the barrier layers of Si-doped $Al_{0.1}Ga_{0.9}N$ and well layers of undoped $In_{0.03}Al_{0.02}Ga_{0.95}N$ were stacked in the order of barrier layer (1)/well layer (1)/barrier layer (2)/well layer (2)/barrier layer (3). In this case, the thickness was set to be 200 Å for the barrier layer (1), 40 Å for the barrier layers (2) and (3), and 70 Å for the well layers (1) and (2). The active layer having a multiquantum well (MQW) structure with the total thickness of about 420 Å was grown.

(p-Type Cladding Layer)

Next, a p-side cladding layer 7 of $Al_{0.2}Ga_{0.8}N$ doped with $1\times10^{20}/cm^3$ of Mg was grown to a thickness of 600 Å in a hydrogen atmosphere at 1050° C. by using TMG, TMA, ammonia, and $Cp_2Mg$ (cyclopentadienyl magnesium).

(p-Type Contact Layer)

Then, a first p-type contact layer of $Al_{0.04}Ga_{0.96}N$ doped with $1\times10^{19}/cm^3$ of Mg was grown to a thickness of 0.1 μm on the p-type cladding layer by using TMG, TMA, ammonia, $Cp_2Mg$. Then, the gas flow rates were adjusted and a second p-type contact layer of $Al_{0.01}Ga_{0.99}N$ doped with $2\times10^{21}/cm^3$ of Mg was grown to a thickness of 0.02 μm.

On completion of the growth, the wafer was annealed in a nitrogen atmosphere at 700° C. in the reaction vessel to further lower the resistance of the p-type cladding layer.

(p-Electrode 12)

After annealing, the wafer was taken out of the reaction vessel and a Rh film of 2000 Å in thickness was grown on the p-type contact layer to form a p-electrode 12. Then, ohmic annealing was carried out at 600° C. and then an insulating protective film 14 of $SiO_2$ was formed to a thickness of 0.3 μm on the exposed surface except for the p-electrode 12.

(Semiconductor-side Adhesion Layer 15, Semiconductor-side Barrier Layer 13, First Conductive Bonding Layer 17a)

Next, a multilayer film of Ti/Pt/Au/Sn/Au was formed on the p-electrode to a thickness of 100 nm/500 nm/300 nm/3000 nm/100 nm. In this case, Ti was the semiconductor-side adhesion layer 15, Pt was the semiconductor-side barrier layer 13, Sn was a first conductive bonding layer 17a, and Au layer between Pt and Sn was a layer for preventing diffusion of Sn to the barrier layer 44, and the outermost Au layer was a layer for improving adhesion strength to a second conductive bonding layer.

(Silicon Substrate 2)

On the other hand, the p-type silicon substrate of 400 μm in thickness, doped with boron, with resistance of 3 Ωcm or less was used as the conductive silicon substrate 2. The silicon substrate 2 was immersed in an organic solution such as acetone to remove an organic material from its surface. Then, the silicon substrate 2 was further immersed in a HF aqueous solution to remove a native oxide film formed on the surface. Thus, the front surface 22 of the silicon substrate 2 was cleaned. Then, sputtering was carried out on the front surface 22 of the silicon substrate 2 using $TiSi_2$ as a target until the film thickness reached 30 Å in growth rate equivalent. Thus, the fourth metal layer 4 made of $TiSi_2$ in a shape of islands was formed. Then, sputtering was carried out using Pt as a target to form a second metal layer 6 made of Pt with a thickness of 250 Å. Thus, a metal electrode 8 was formed on the silicon substrate 2. Then, a second conductive bonding layer 17b made of Pd was formed thereon with a thickness of 350 nm.

Next, the first conductive bonding layer 17a and the second conductive bonding layer 17b are placed facing each other and heat pressure welding was carried out at the heater temperature of 250° C. Thus, the first conductive bonding layer 17a and the second conductive bonding layer 17b were diffused to each other and the conductive bonding layer 17 was formed.

(Removal of Growth Substrate 20)

Next, after removing the sapphire substrate 1 by grinding, the exposed buffer layer and the high temperature grown layer were polished until the n-type cladding layer was exposed, so as to substantially eliminate the surface roughness.

(n-Electrode 16)

Next, a multilayer electrode of Ti/Pt/Au was disposed with a thickness of 5 nm/100 nm/1800 nm on the n-type cladding layer functioning also as the n-type contact layer to form the n-electrode 16. Then, the silicon substrate 2 is polished to a thickness of 100 μm, and a first metal layer 4' of $TiSi_2$ having a shape of islands and a second metal layer 6' of Pt were formed on the back surface 24 of the silicon substrate 2 were formed to a thickness of 2500 Å in the similar manner as in the front surface side 22 of the silicon substrate 2 to form a metal electrode 8', then, an AU layer was further formed with a thickness of 5000 Å. Next, devices were separated by dicing.

The nitride semiconductor devices thus obtained exhibited excellent adhesion between the silicon substrate 2 and the metal electrodes 8, 8'.

The adhesion between the silicon substrate and the metal electrodes 8, 8' can be evaluated, for example, by modified Edge Liftoff Test (mELT method) proposed by KOBELCO Research Institute, Inc. In the modified Edge Liftoff Test, an epoxy resin is applied to a measurement sample. The sample is heated and diced into 10 mm square pieces and cooled with liquid nitrogen. The adhesion is determined by the temperature at which detachment of the film is observed. That is, the fracture toughness $K_{app}$ [MPa·m$^{1/2}$] is calculated based on the temperature T at which detachment occurs, the residual stress a of the epoxy resin, and the thickness h of the epoxy resin.

$$K_{aap} = \sigma \cdot (h/2)^{1/2}$$

wherein, the residual stress a of the epoxy resin at temperature T can be calculated by the formula as follows based on Cf, m, and c of the epoxy resin.

$$\sigma = C_f T^2 - mT - c$$

$TiSi_2$, Pt layer of 1200 Å, Au layer of 1200 Å, and Ti layer of 100 Å (to enhance adhesion with an epoxy resin) are formed on the silicon substrate in the similar manner as in Example 1. The fracture toughness $K_{app}$ was measured with varying the thickness of $TiSi_2$ in a range between 0 Å and 100 Å. The fracture toughness of the sample in which $TiSi_2$ was not formed (thickness of 0 Å) was about 0.15 [MPa·m$^{1/2}$]. On the other hand, the fracture toughness $K_{app}$ of each of the samples in which $TiSi_2$ was formed was approximately 0.3 [MPa·m$^{1/2}$], which is about twice the improvement in the fracture toughness.

EXAMPLE 2

A nitride semiconductor device is formed in a similar manner as in Example 1, except that the first metal layer is $NiSi_2$. The nitride semiconductor device having significantly excellent adhesion between the silicon substrate and the metal electrodes 8,8' is obtained similarly as in Example 1.

EXAMPLE 3

A nitride semiconductor device is formed in a similar manner as in Example 1, except that the p-type silicon substrate is used in place of the n-type silicon substrate and the second metal layer 6 is Ti. The nitride semiconductor device having significantly excellent adhesion between the silicon substrate and the metal electrodes 8,8' is obtained similarly as in Example 1.

EXAMPLE 4

In Example 4, a device is fabricated using a process shown in FIG. 6. Similarly as in Example 1, the back surface 24 of the silicon substrate 2 is polished to reduce the thickness of the silicon substrate 2 from 400 μm to 100 μm. In this example, subsequently, a process for polishing the back surface 24 is performed. Then, after the polishing process, the metal electrode 8' is formed. As compared with the case of Example 1, the nitride semiconductor device having further improved adhesion between the back surface 25 of the silicon substrate 2 and the metal electrode 8' is obtained.

COMPARATIVE EXAMPLE 1

In a case where the $TiSi_2$ layer is not formed as islands but formed as a continuous layer at a thickness of 100 Å, and the Pt film is formed at a thickness of 1200 Å, ohmic connection between the silicon substrate and the $TiSi_2$ layer is not obtained. Accordingly, such a device as will be described below is fabricated. A nitride semiconductor device for comparison was formed in the same manner as in Example 1 except that the metal electrodes 8, 8' are changed. In this comparative example, a continuous $TiSi_2$ layers are formed at a thickness of 100 Å on the front surface 22 and the back surface 24 of the silicon substrate 2 in place of island-shaped first metal layers 4, 4'. Then, Pt films are formed at a thickness of 1200 A in place of the second metal layers 6, 6'. The Pt film is formed on the $TiSi_2$ layer, so that it is not in direct contact with the silicon substrate 2.

Ohmic contact between the silicon substrate 2 and $TiSi_2$ layer cannot be formed in the device for comparison thus obtained, so that its driving power is substantially greater than that in the device according to Example 1. This device for comparison has a high driving power, even when one of the metal electrode 8 at the front surface side 22 or the metal electrode 8' at the back surface side 24 of the silicon substrate 2 is changed to an electrode including a $TiSi_2$ layer and a Pt film.

COMPARATIVE EXAMPLE 2

A nitride semiconductor device for comparison was formed in the same manner as in Example 1 except that the metal electrode 8' was changed. In this comparative example, a continuous $TiSi_2$ layer was formed with 100 Å thickness on the back surface 24 of the silicon substrate 2 in place of island-shaped first metal layers 4'. Subsequently, the silicon substrate 2 is annealed at 600° C. and $TiSi_2$ layer of 200 Å thickness was formed from the Ti layer. Then, a Pt film was formed with a thickness of 1200 Å in place of the second metal layer 6'. The Pt film was formed on the $TiSi_2$ layer and was not in direct contact with the silicon substrate 2.

In this method, detachment may occur in the vicinity of the first conductive bonding layer 17a and the second conductive bonding layer 17b disposed between the silicon substrate 2 and the nitride semiconductor layer 10, which then cause detachment of the silicon substrate from the nitride semiconductor layer, so that a device cannot be obtained.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application is based on applications No. 2007-143208 filed in Japan on May 30, 2007, and No. 2008-138074 filed in Japan on May 27, 2008, the contents of which are incorporated hereinto by reference.

What is claimed is:

1. A nitride semiconductor device comprising:
a silicon substrate;
a nitride semiconductor layer formed on the silicon substrate; and
a metal electrode formed in contact with the silicon substrate;
wherein the metal electrode has a first metal layer which is in contact with the silicon substrate and is separately formed on a surface of the silicon substrate in a shape of discrete islands, and a second metal layer which is formed in contact with the silicon substrate exposed among the islands of the first metal layer and which covers the first metal layer, and wherein the second metal layer is made of a metal capable of establishing ohmic contact with silicon and the first metal layer is made of an alloy containing a metal and silicon, in which the metal is different than that in the second metal layer.

2. The nitride semiconductor device according to claim 1, wherein the first metal layer is made of an alloy containing a transition metal and silicon.

3. The nitride semiconductor device according to claim 1, wherein the first metal layer is made of an alloy containing at least an element selected from Ti, W, Co, and Ni, and silicon.

4. The nitride semiconductor device according to claim 1, wherein the mean diameter of the islands of the first metal layer is 100 Å or less.

5. The nitride semiconductor device according to claim 1, wherein thickness of the first metal layer is in a range from 5 to 100 Å.

6. The nitride semiconductor device according to claim 1, wherein the silicon substrate is of a p-type and the second metal layer contains at least one element of the platinum group as a major component.

7. The nitride semiconductor device according to claim 6, wherein the second metal layer contains Pt as a major component.

8. The nitride semiconductor device according to claim 1, wherein the silicon substrate is of an n-type and the second metal layer contains Ti or Al as a major component.

9. The nitride semiconductor device according to claim 1, wherein the silicon substrate and the nitride semiconductor layer are bonded by a conductive bonding layer.

10. The nitride semiconductor device according to claim 1, wherein the metal electrode is formed on a first main surface of the silicon substrate and the nitride semiconductor layer is formed on the metal electrode.

11. The nitride semiconductor device according to claim 1, wherein the metal electrode is formed on a second main surface of the silicon substrate and the nitride semiconductor layer is formed on the first main surface facing the second main surface.

12. The nitride semiconductor device according to claim 10, wherein the metal electrode is also formed on the second main surface of the silicon substrate.

13. The nitride semiconductor device according to claim 1, wherein the first metal layer is made of a material different than that of the silicon substrate.

14. The nitride semiconductor device according to claim 1, wherein the first metal layer is formed on the surface of the silicon substrate by sputtering using a target made of a silicon alloy.

* * * * *